(12) United States Patent
Gibson et al.

(10) Patent No.: US 10,608,409 B1
(45) Date of Patent: Mar. 31, 2020

(54) CALIBRATION OF LASER POWER MONITOR IN AN IMAGING SYSTEM OF A WEARABLE HEAD MOUNTED DISPLAY

(71) Applicant: Microsoft Technology Licensing, LLC, Redmond, WA (US)

(72) Inventors: Gregory Theodore Gibson, Seattle, WA (US); Scott Jeffrey Woltman, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/165,681

(22) Filed: Oct. 19, 2018

(51) Int. Cl.
*H01S 5/0683* (2006.01)
*G02B 27/01* (2006.01)

(52) U.S. Cl.
CPC ........ *H01S 5/0683* (2013.01); *G02B 27/0172* (2013.01); *G02B 2027/0132* (2013.01)

(58) Field of Classification Search
None
See application file for complete search history.

(56) References Cited

U.S. PATENT DOCUMENTS

| | | | |
|---|---|---|---|
| 5,659,414 A | 8/1997 | Appel et al. | |
| 6,271,808 B1* | 8/2001 | Corbin | G02B 27/0172 345/7 |
| 2010/0060551 A1* | 3/2010 | Sugiyama | G02B 26/06 345/8 |
| 2011/0050655 A1* | 3/2011 | Mukawa | G02B 27/0172 345/204 |
| 2013/0162673 A1* | 6/2013 | Bohn | G02B 27/0172 345/633 |
| 2013/0208362 A1* | 8/2013 | Bohn | G02B 26/00 359/630 |
| 2013/0208482 A1* | 8/2013 | Fleck | G02B 27/017 362/293 |
| 2013/0242056 A1* | 9/2013 | Fleck | H04N 13/296 348/47 |
| 2013/0314793 A1* | 11/2013 | Robbins | G02B 5/18 359/573 |

(Continued)

OTHER PUBLICATIONS

"International Search Report and Written Opinion Issued in PCT Application No. PCT/US2019/052532", dated Dec. 18, 2019, 13 Pages.

*Primary Examiner* — Crystal L Hammond
(74) *Attorney, Agent, or Firm* — Karin L. Williams; Mayer & Williams PC

(57) ABSTRACT

A wearable display includes left and right display lens systems each having imaging units configured for augmented reality imaging. The imaging units include an emitter structure, one or more optical elements, a display optic, an electrically alterable scanning optical element and a calibration light sensor. The emitter structure has one or more light sources configured to emit light. The optical elements direct the light along a light path in the imaging unit. The scanning optical element receives the light from the optical elements and directs it to the display optic. The scanning optical element scans in one or more dimensions to direct the light through an imaging optic that directs the light into the display optic. The calibration light sensor is located at a point along the light path between the emitter structure and the scanning optical element and receives a portion of light from one of the optical elements.

20 Claims, 7 Drawing Sheets

(56) References Cited

U.S. PATENT DOCUMENTS

2014/0285429 A1* 9/2014 Simmons ............ G02B 27/225
 345/156
2018/0035087 A1 2/2018 Xu
2018/0045955 A1 2/2018 Alexander et al.

* cited by examiner

CALIBRATION OF LASER POWER MONITOR IN AN IMAGING SYSTEM OF A WEARABLE HEAD MOUNTED DISPLAY

BACKGROUND

Mixed-reality computing devices, such as wearable head mounted display (HMD) systems and mobile devices (e.g. smart phones, tablet computers, etc.), may be configured to display information to a user about virtual and/or real objects in a field of view of the user and/or a field of view of a camera of the device. For example, an HMD device may be configured to display, using a see-through display system, virtual environments with real-world objects mixed in, or real-world environments with virtual objects mixed in.

As an emerging technology, there are many challenges and design constraints with mixed-reality devices, from generation of the virtual objects and images so that they appear realistic in a real environment, to developing the optics small and precise enough for implementation with a wearable display device. There are also challenges to developing illumination sources for implementation as micro projectors and/or imaging units for wearable display devices.

The illumination sources for the micro projectors typically employ three light emitters such as laser diodes for providing the red, green and blue (RGB) components of the light. The light that is emitted is moved across a surface, such as via a MEMS mirror, liquid crystal (LC) scanner, or by moving optics. However, the light efficiency of each light emitter can vary based on factors such as production and material variances, bonding issues, connectivity issues, driver variance, micro-optics, color conversion variance, temperature, and/or optic differences across the surface.

SUMMARY

In embodiments, a wearable display device includes left and right display lens systems configured for augmented reality imaging. The left and right display lens systems respectively include left and right imaging units which are configured to generate an augmented reality image. One or both of the left and right imaging units includes an emitter structure, one or more optical elements, a display optic, an electrically alterable scanning optical element and a calibration light sensor. The emitter structure has one or more light sources configured to emit light. The one or more optical elements are configured to direct the light along a light path in the imaging unit and the display optic is located in the light path. The electrically alterable scanning optical element is configured to receive the light from the one or more optical elements and direct the light to the display optic. The electrically alterable scanning optical element is configured to scan in at least one dimension to direct the light through an imaging optic that directs the light into the display optic. The calibration light sensor is arranged to receive a portion of the light from one of the one or more optical elements. The calibration light sensor is located at a point along the light path between the emitter structure and the electrically alterable scanning optical element.

In certain embodiments the light source(s) in the emitter structure are laser diodes that each include a monitor photodiode configured to receive light emitted from a back facet of the laser diode. In these embodiments sensor data from the calibration light sensor, which is representative of the power emitted from the front facet of the laser diode, may be used to calibrate the monitor photodiodes during a calibration process.

In certain embodiments in which the emitter structure includes a plurality of light sources, the calibration process may be performed by sequentially pulsing each of the light sources so that only a single one of the light sources emit light at any given time. In this way each monitor photodiode may be individually calibrated using the sensor data from the calibration light sensor.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure. It will be appreciated that the above-described subject matter may be implemented as a computer-controlled apparatus, a computer process, a computing system, or as an article of manufacture such as one or more computer-readable storage media. These and various other features will be apparent from a reading of the following Detailed Description and a review of the associated drawings.

DETAILED DESCRIPTION

Figure 1:
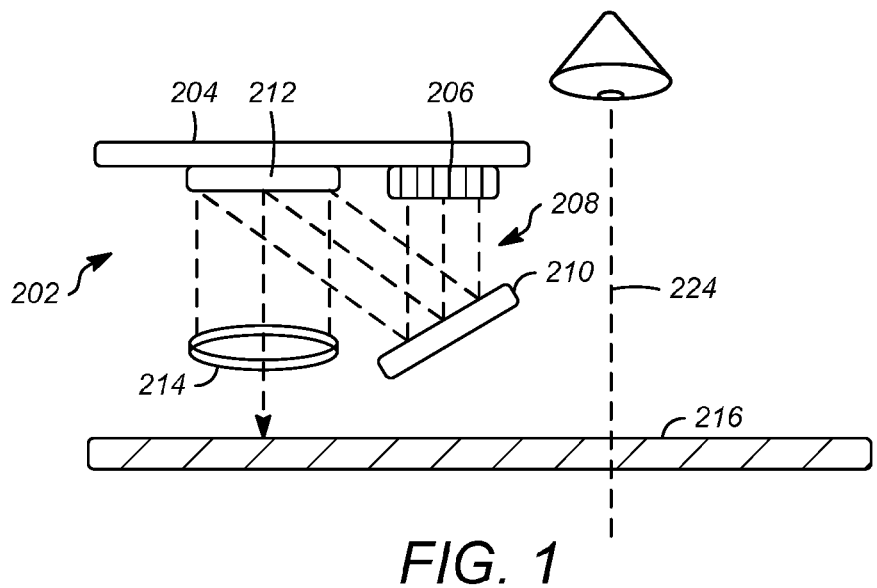
FIG. 1 is a schematic diagram of one example of an imaging unit that may be employed, for instance, in a wearable head mounted display.

FIG. 1 shows one example of an imaging unit that may be employed, for instance, in a wearable head mounted display. The imaging unit 202 includes a printed circuit board 204 that incorporates a light emitter structure 206. The light emitter structure 206 can be implemented, for example, with red, green and/or blue light sources such as but not limited to laser diodes, inorganic light emitting diodes (iLEDs), or organic light emitting diodes (OLEDs) that are arranged in various one-dimensional (1D), two-dimensional (2D), or n-dimensional arrays.

The imaging unit 202 includes optics that direct the light from the light emitter structure 206 along a light path in the imaging unit 202. For example, the light from the emitter structure 206 may be directed to a reflector 210, which reflects the light to illuminate an electrically alterable scanning optical element 212, such as a micro-electro-mechanical (MEMs) scanning mirror, a liquid crystal (LC) optic for beam steering, a Switchable Bragg Grating (SBG), and/or with any other types of optics or combination of optics that can be implemented for light control. In some embodiments the electrically alterable scanning optical element 212 may also be incorporated with the printed circuit board 204. The imaged light is then directed by the scanning optical element 212 through an imaging optic 214 that directs the light into a display optic 216, such as a see-through, waveguide plate, where it can be viewed as a virtual object by a user of a wearable display device or other near-to-eye display. In addition, light 224 from the real world environment is transmitted through the display optic 216 and projected through the waveguide for viewing by a user. The see-through waveguide plate (i.e., the display optic 216) may be implemented for internal reflection to thereby conduct visible light of a virtual image that is generated by the imaging unit 202 for viewing by a user, while also passing through the light 224 from the surrounding environment for viewing by the user.

Figure 2:
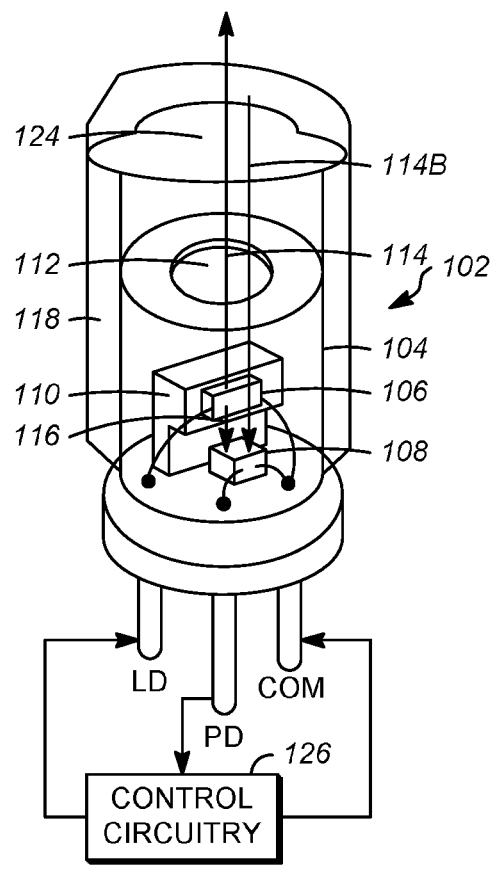
FIG. 2 is a schematic diagram of shows one example of a light source that may be employed by a light emitter structure of a wearable head mounted display.

FIG. 2 shows one example of a light source that may be employed by the light emitter structure 206. In this example the light source is a laser diode package that emits one color (e.g., red, green and/or blue). In some implementations the light emitter structure 206 may employ at least three such laser diode packages each generating a different color of light. As previously mentioned, in other implementations additional laser sources (e.g., laser diode packages) may be arranged in various one-dimensional (1D), two-dimensional (2D), or n-dimensional arrays.

The laser diode package 102 shown in FIG. 2 includes a casing 104 (also called a can) which houses a die for the laser diode 106, a die for monitor photodiode 108 and a heat sink 110. Heat sink 110 is used to dissipate heat generated by the laser diode die. The casing 104 includes a window 112 through which the laser beam or illumination signal generated by the laser diode die passes. The laser beam is represented by arrow 114 in FIG. 2. Of course, the beam 114 may represent a divergent beam of non-collimated light when leaving the laser diode 106. In FIG. 2, outer structural element 118 of the laser diode package supports optical element 124. Lens 124 is representative of one or more optical elements for collimating light beam 114. In some embodiments, the lens 124 may be external to the laser package and bonded to a different housing. In others, the lens could be implemented as the window 112 to the laser package 102.

Generally, laser diodes will emit power from both ends of the resonant cavity in which the diode structure is contained. This is a function of the laser cavity design and the reflectivity of the coatings applied to each end of the resonant cavity. The beam or emission from the back facet of the laser diode in FIG. 2 is represented by arrow 116. The rear emission or reverse illumination signal from the back facet of the laser diode 106 is received by a monitor photodiode 108. The photodiode utilizes optical charge carrier generation to sense and measure the light produced by the laser diode. Additionally, the monitor photodiode 108 receives the reflected light represented by 114b. The monitor photodiode 108 monitors the reverse illumination signal as an indicator of the output power of the illumination signal from the laser diode 106.

The black circles on the lower surface of the casing 104 correspond to a lead or other connection (LD) from the package for connection by an input drive signal to the laser diode from control circuitry 126, a connector (PD) for an output signal from the photodiode 108 to the control circuitry 126, and a common or ground connector (COM) which may also be connected to the control circuitry 126. Other embodiments may add additional pins and connectors to the package to separate the laser diode and photodiode ground connectors to eliminate potential cross-talk.

While the monitor photodiode 108 can provide an indication of the output power from the laser diode 106, it typically suffers from high error and needs to be periodically calibrated to be sufficiently accurate for use as a power monitor. In other words, the signal from the monitor photodiode 108 measuring back facet emission is not perfectly correlated to front facet emission.

In one aspect, a method and apparatus is provided for calibrating the monitor photodiode in the laser diode(s) employed in an emitter structure of an imaging unit such as shown in FIG. 1. If laser sources other than laser diodes are employed, the method and apparatus may be used to calibrate whatever mechanism is being employed to monitor the output power from the laser source. However, for purposes of illustration the method and apparatus will be described in terms of a laser diode package that employs a photodiode to monitor light from the rear facet of the laser diode.

Figure 3:
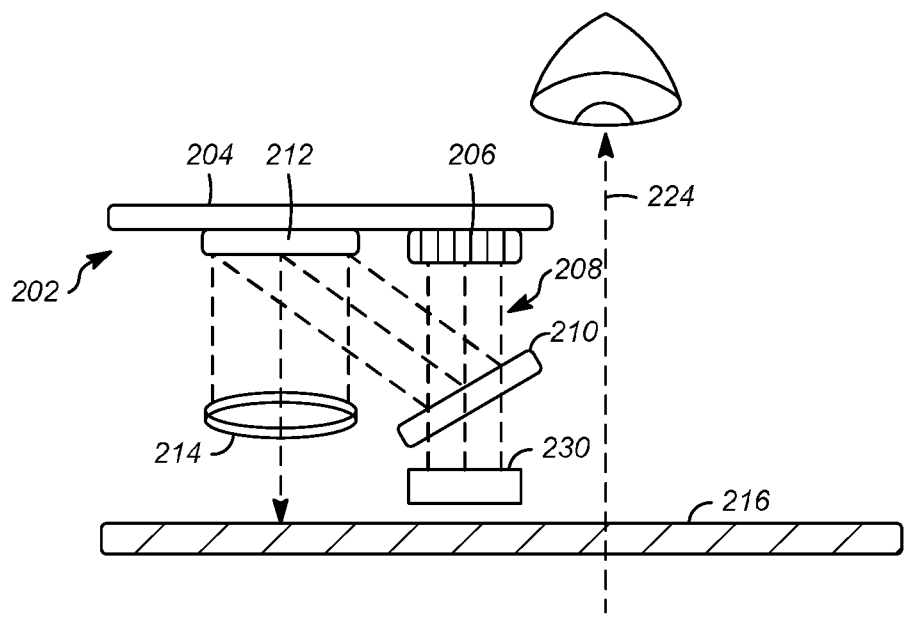
FIG. 3 a schematic diagram of the illustrative imaging unit of FIG. 1 with the addition of a single light sensor such as a photodiode that may be used to calibrate the laser source(s) used in the light emitter structure.

FIG. 3 shows the illustrative imaging unit of FIG. 1 with the addition of a single light sensor such as a photodiode that may be used to calibrate the laser source(s) used in the light emitter structure. In FIGS. 1 and 3 like elements are denoted by like reference numerals. As shown, a calibration photodiode 230 or other light sensor is located behind the reflective mirror 210 (i.e., on a side of the reflective mirror 210 opposite from the side that receives the light 208 from the emitter structure 206). In this case the reflective mirror 210 is a partially reflective mirror that reflects the majority of the incident light and transmits therethrough a small portion of the light. For example, in some implementations the partially reflective mirror 210 may reflect at least 90% of the light while transmitting the remaining portion of the light. In another implementation, the partially reflective mirror 210 may reflect 99% (or more) of the light while transmitting 1% (or less) of the light.

Figure 4:
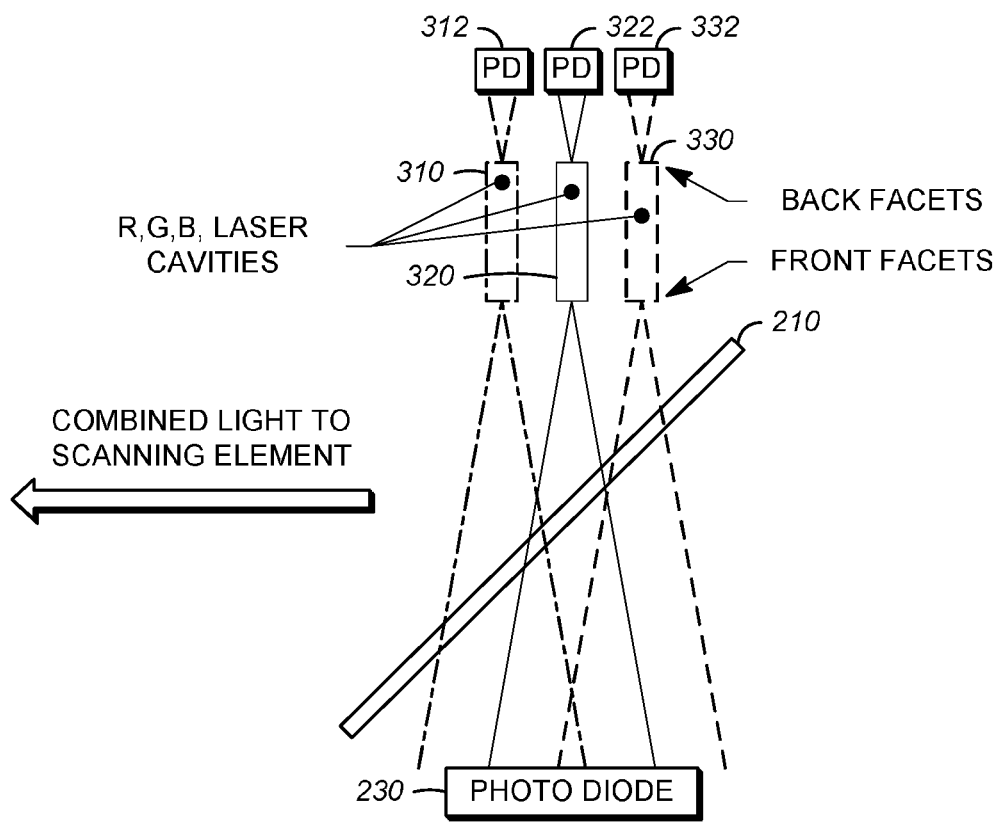
FIG. 4 is schematic diagram illustrating an emitter structure that employs three light diodes whose front facet emission is directed to a calibration photodiode.

Calibration photodiode 230 thus receives the portion of light 208 emitted by emitter structure 206 that is transmitted through the partially reflective mirror 210. That is, calibration photodiode 230 is positioned to receive a portion of light from each of the light sources in the emitter structure 206. If, for instance, as shown in FIG. 4, the emitter structure 206 employs three light diodes 310, 320 and 330 emitting red, green and blue light, respectively, the calibration photodiode 230 will receive a portion of the front facet emission from all three diodes.

In operation, a calibration process may be periodically performed using the calibration photodiode 230 to provide real-time calibration of the monitor photodiodes 108 employed in the laser diodes of the emitter structure 206. In one implementation this may be accomplished by sequentially pulsing each of the laser diodes (e.g., laser diodes 310, 320 and 330) on and off so that at any given time in the sequence the calibration photodiode 230 receives light from only a single one of the laser diodes. In this way the power detected by the calibration photodiode 230, which is representative of the front facet emission from each of the laser diodes, can be correlated with the power from the back facet emission of the laser diodes as detected by the monitor photodiodes (e.g., monitor photodiodes 312, 322 and 332 respectively associated with laser diodes 310, 320 and 330).

Figure 5:
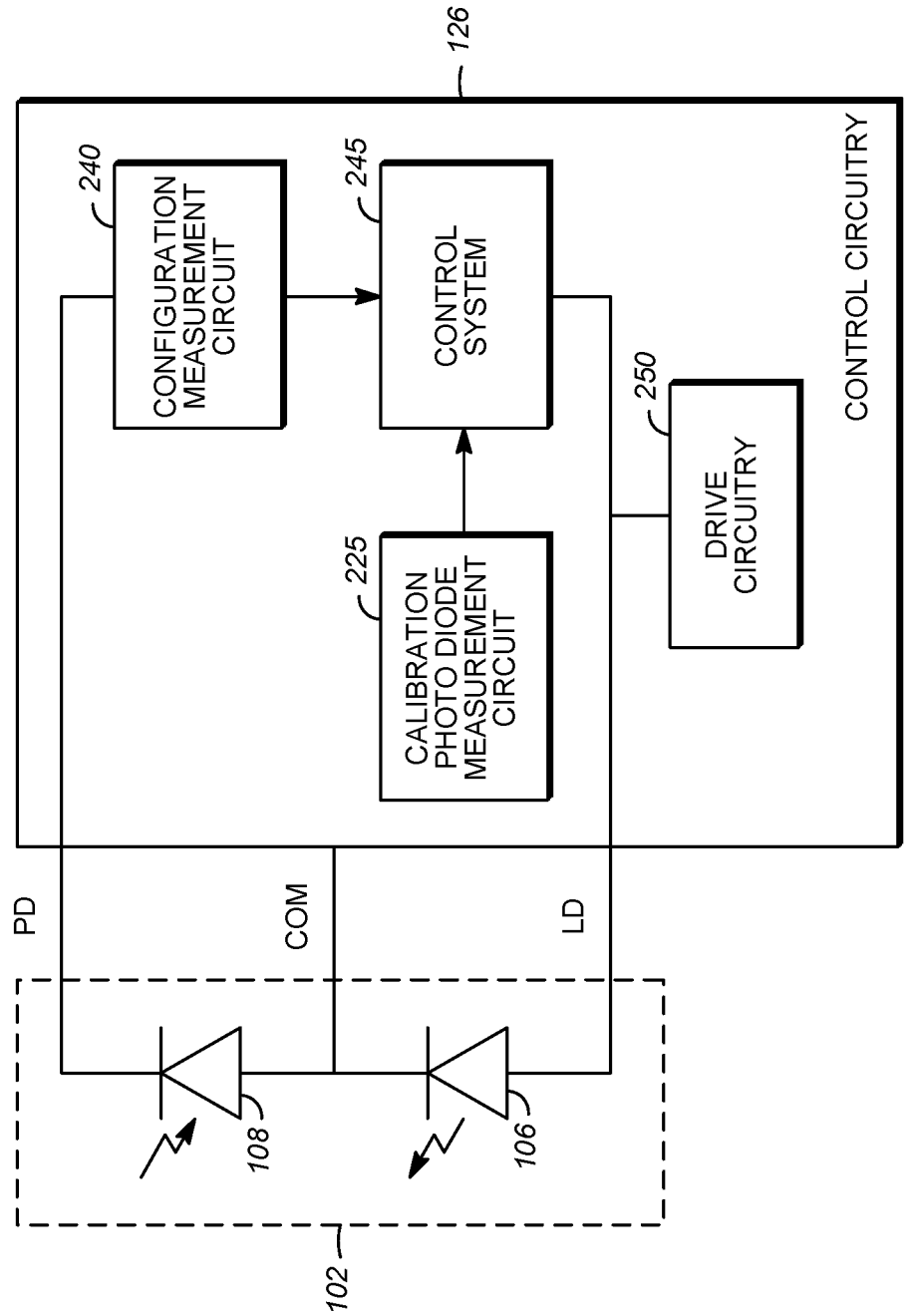
FIG. 5 is a block diagram of one example of control circuitry 126 that may be employed for calibrating the monitor photodiode of one of the laser diodes using measurements obtained from the calibration photodiode 230.

FIG. 5 is a block diagram of one example of control circuitry 126 that may be employed for calibrating the monitor photodiode of one of the laser diodes using measurements obtained from the calibration photodiode 230. The laser diode lead LD is connected to a first lead of the control circuitry 126 which connects to a drive circuit 250 and a control system 245. When driving laser diode 106 to produce laser emissions, the control system 245 provides a current input via drive circuit 250. The laser diode 106 may be placed between the drive circuit 250 and a common COM. In other embodiments the laser diodes may have their own COMs Photodiode lead PD connects to a configuration measurement circuit 240, which in this example measures current. In one example the monitor photodiode 108 outputs a current representative or based upon the light intensity or power level received from the reverse illumination signal and the reflected light. In other examples, another characteristic of the output signal, for example voltage, phase or frequency, may be used as the measurement characteristic. The control system 245 includes logic which may be in the form of firmware and/or software instructions, which adjusts the current supplied to the laser diode 106 based on the signal received from the configuration measurement circuit 240 in order to maintain the light output from the front facet of the laser diode 106 at the appropriate power level. During a periodic calibration process, the control system 245 receives a signal from the calibration photodiode measurement circuit 255 that is representative of the front facet emission from the laser diode 106, which is used by the control system 245 to calibrate the signal received from the configuration measurement circuit 240 so that this signal is properly correlated with the front facet emission from the laser diode 106.

While the embodiment of the invention shown in FIG. 3 locates the calibration photodiode 230 behind the partially reflective mirror 210, more generally in other embodiments the photodiode may be positioned at any location in the imaging system from which it is able to receive a portion of the light emitted by the emitter structure 206 prior to the light being directed to the electrically alterable scanning optical element 212. For instance, in one alternative embodiment the partially transmissive mirror 210 may transmit therethrough the majority of the incident light and only reflect a small portion of the light. In this embodiment the calibration photodiode 230 may be positioned to receive the reflected light from the partially reflective mirror while the electrically alterable scanning optical element 212 may be positioned to receive the light transmitted by the partially reflective mirror 210. For example, in some implementations the partially reflective mirror 210 may transmit at least 90% of the light while reflecting the remaining portion of the light. In another implementation, the partially reflective mirror 210 may transmit 99% (or more) of the light while reflecting 1% (or less) of the light.

As described with reference to FIGS. 6 and 7, a wearable display device (e.g., glasses or a head-mounted display) can be implemented with left and right display lens systems that each include an embodiment of an imaging unit, such as the imaging unit 202. The wearable display device and/or a controller unit of the wearable display device implements embodiments of the imaging unit calibration process in conjunction with control circuitry such as illustrated by the example shown in FIG. 5.

Figure 6:
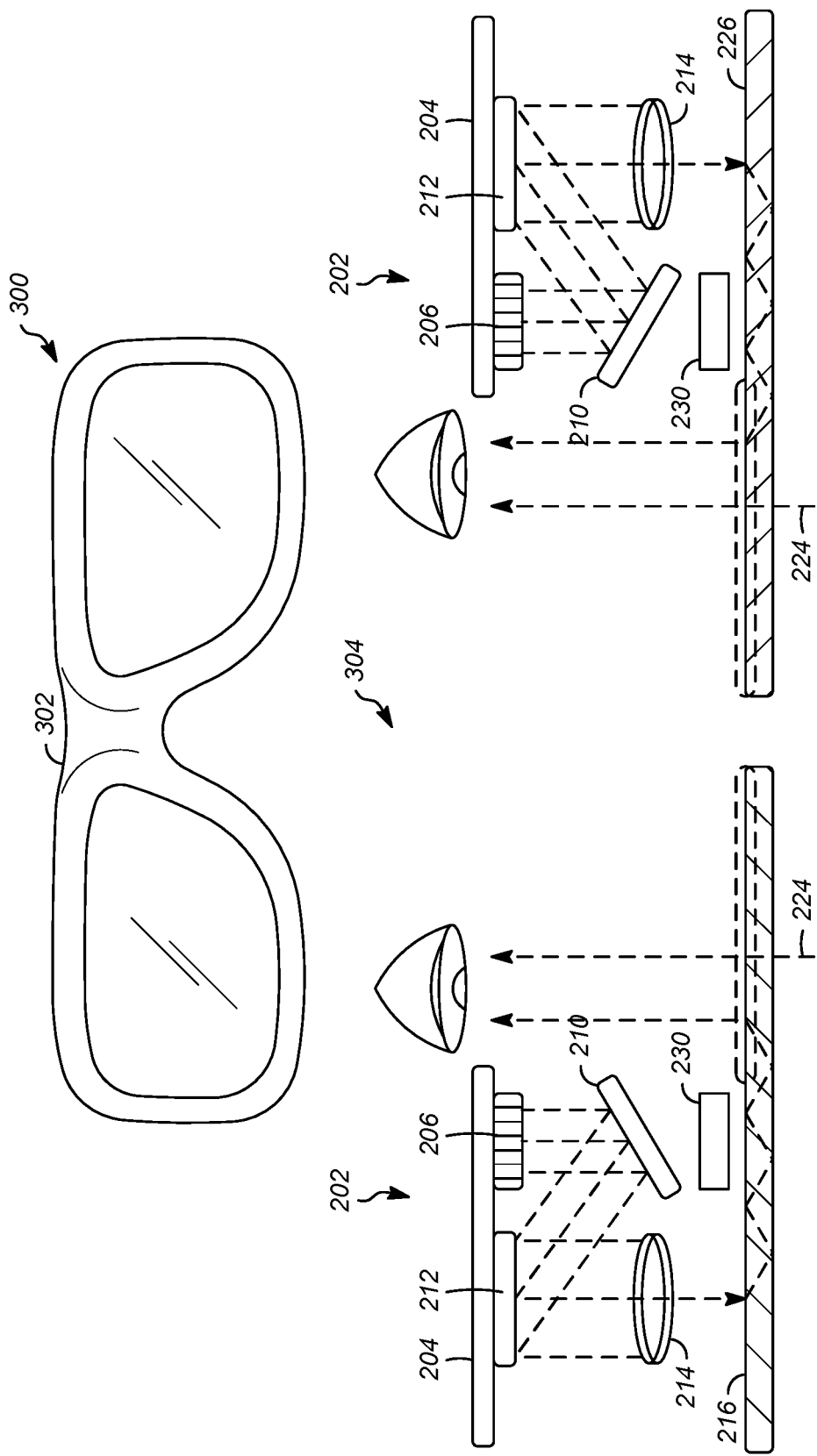
FIG. 6 is a schematic diagram illustrating an example system in which various embodiments of imaging unit calibration can be implemented.

FIG. 6 illustrates an example system 300 in which various embodiments of imaging unit calibration can be implemented. An example wearable display device 302 includes a display lens system 304 In embodiments, the display lens system 304 can be implemented as left and right imaging units 202 of the type described with reference to FIG. 3. A wearable display device can be implemented as any type of glasses or head-mounted display (HMD) that includes implementations of the display lens system 304 through which a user can view the surrounding environment, yet also see virtual images that are generated for display and appear as a part of the environment. References to a left imaging system and a right imaging system, as described herein, correlate to a user's left and right eyes (e.g., from the perspective of wearing and looking through the wearable display device).

Figure 7:
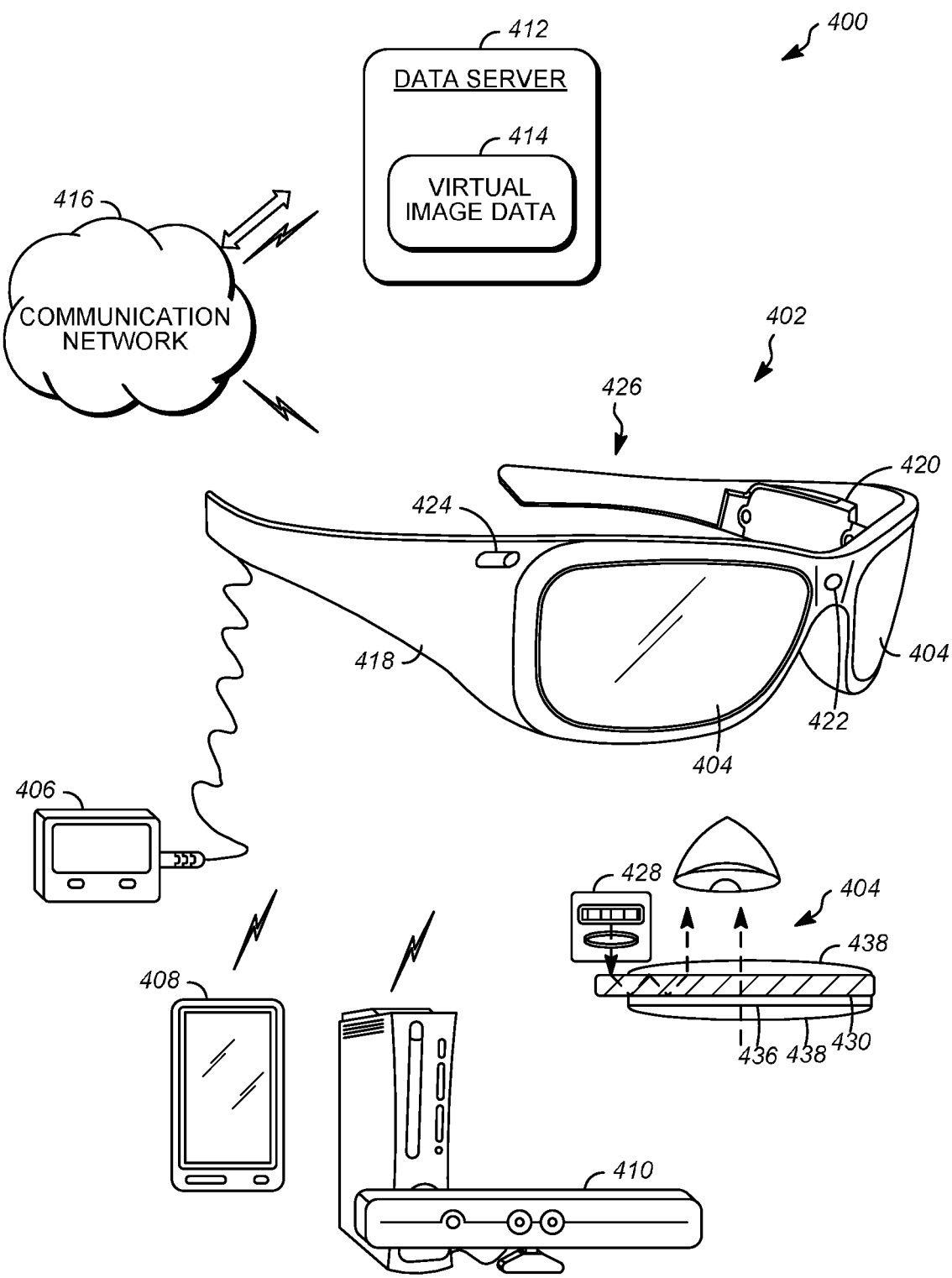
FIG. 7 a schematic diagram illustrating an example system that includes an example wearable display device in which embodiments of the imaging unit described herein can be implemented.

FIG. 7 illustrates an example system 400 that includes an example wearable display device 402 in which embodiments of the imaging unit described herein can be implemented. The wearable display device can be implemented as any type of glasses or head-mounted display (HMD) that includes a display lens system 404 through which a user can view the surrounding environment, yet also see virtual images (e.g., any type of object, video, text, graphic, and the like) that are generated for display and appear as a part of the environment. The display lens system 404 may include an embodiment of the imaging unit 202 shown in FIG. 3.

The wearable display device 402 can be implemented as an independent, portable system that includes memory, software, a processor, and/or a power source. Alternatively or in addition, the wearable display device may be communicatively linked to a controller 406 that includes any one or combination of the memory, software, processor, and/or power source, such as a battery unit. The controller 406 can be implemented for wired or wireless communication with the wearable display device. The controller and/or the wearable display device can also be implemented with any number and combination of differing components as further described with reference to the example device shown in FIG. 9. For example, the controller and/or the wearable display device may include an application implemented as computer-executable instructions, such as a software application, and executed by a processor to implement embodiments of the imaging unit calibration process as described herein.

In embodiments, the controller may be implemented as a dedicated device (e.g., the wired controller 406), as a mobile phone 408, a tablet or other portable computer device, a gaming system 410, or as any other type of electronic device that can be implemented to process and generate virtual images for display as part of the environment that is viewed through the display lens system of the wearable display device. The controller may communicate with the wearable display device wirelessly via WiFi, Bluetooth, infrared (IR), RFID transmission, wireless Universal Serial Bus (WUSB), cellular, or via other wireless communication techniques.

The example system 400 also includes a data server 412, or data service, that communicates, or otherwise distributes, virtual image data 414 to the wearable display device 402 via a communication network 416. For example, the data server may be part of a network-based gaming system that generates virtual images for augmented reality display at the wearable display device. Alternatively, the data server may be part of a navigation system that communicates navigation directions and information for display in the display lens systems 404 of the wearable display device. In another example, the data server may be part of a messaging service, such as an e-mail or text messaging system, that communicates e-mail and/or text messages to the wearable display device for display in the display lens systems, where a user can read a message as an augmented reality image that is displayed over the environment viewed through the wearable display device.

Any of the devices, servers, and/or services can communicate via the communication network 416, which may be implemented to include wired and/or wireless networks. The communication network can also be implemented using any type of network topology and/or communication protocol, and can be represented or otherwise implemented as a combination of two or more networks, to include IP-based networks and/or the Internet. The communication network may also include mobile operator networks that are managed by mobile operators, such as a communication service provider, cell-phone provider, and/or Internet service provider.

The wearable display device 402 includes a frame 418, such as in the form of glasses, goggles, or any other structure, that supports and incorporates the various components of the device, as well as serves as a conduit for electrical and other component connections. A components module 420 (or components modules on the left, right, and/or both sides of the device frame) incorporates any of the various components, such as processing and control circuitry, memory, software, a processor, GPS transceiver, and/or power source. The wearable display device may also include a microphone 422 to record audio data from the surrounding environment, as well as ear phones for audio feedback as part of an augmented reality experience.

The wearable display device 402 also includes various cameras 424 that capture video and still images of the surrounding environment. The image and video data can be processed on the device and/or by a controller device (e.g., controller 406), and used to create a mapping field to orient and track a user in the environment space. The wearable display device can also include eye tracking cameras used to determine a user's eyeball location and track eye movements. The wearable display device may also include a temperature sensor, as well as inertial sensors and/or attitude sensors, including MEMS gyros, magnetic sensors (e.g., a compass), and acceleration sensors for sensing position, orientation, and acceleration of the wearable display device.

In embodiments, the imaging system 428 (which includes various components of the imaging unit described herein) can be implemented to include an infra-red (IR) laser utilized for system calibrations and/or as an illumination source for an eye-tracking system and camera that tracks the position of a user's eyes. The eye-tracking system includes the eye-tracking illumination source, which is not a visible light, and includes an eye-tracking IR sensor. In implementations that include color conversion, the illumination source can be implemented as UV or blue iLED arrays, and a color conversion implemented to emit IR light from one or more of the pixels. The IR sensor can be implemented as an IR camera that provides infrared image data of the eye for eye-tracking processing, or an IR sensor that detects eye reflections when the eye is illuminated. Alternatively or in addition, sensors can be implemented in the CMOS driver array to detect the feedback. The see-through waveguide plate 430 can also be utilized for the infrared illumination, and for eyeball reflections that the eye-tracking system uses to track the position of the user's eyes.

In this example, the display lens systems 404 include an optional opacity filter 436, and a see-through lens 438 on each side of the waveguide plate 430. The see-through lenses can be standard eye-glass lenses and made to prescription (or no prescription). The opacity filter selectively blocks natural light, either uniformly or on a per-pixel basis, from passing through the see-through waveguide plate to enhance the contrast of a displayed virtual image.

Figure 8:
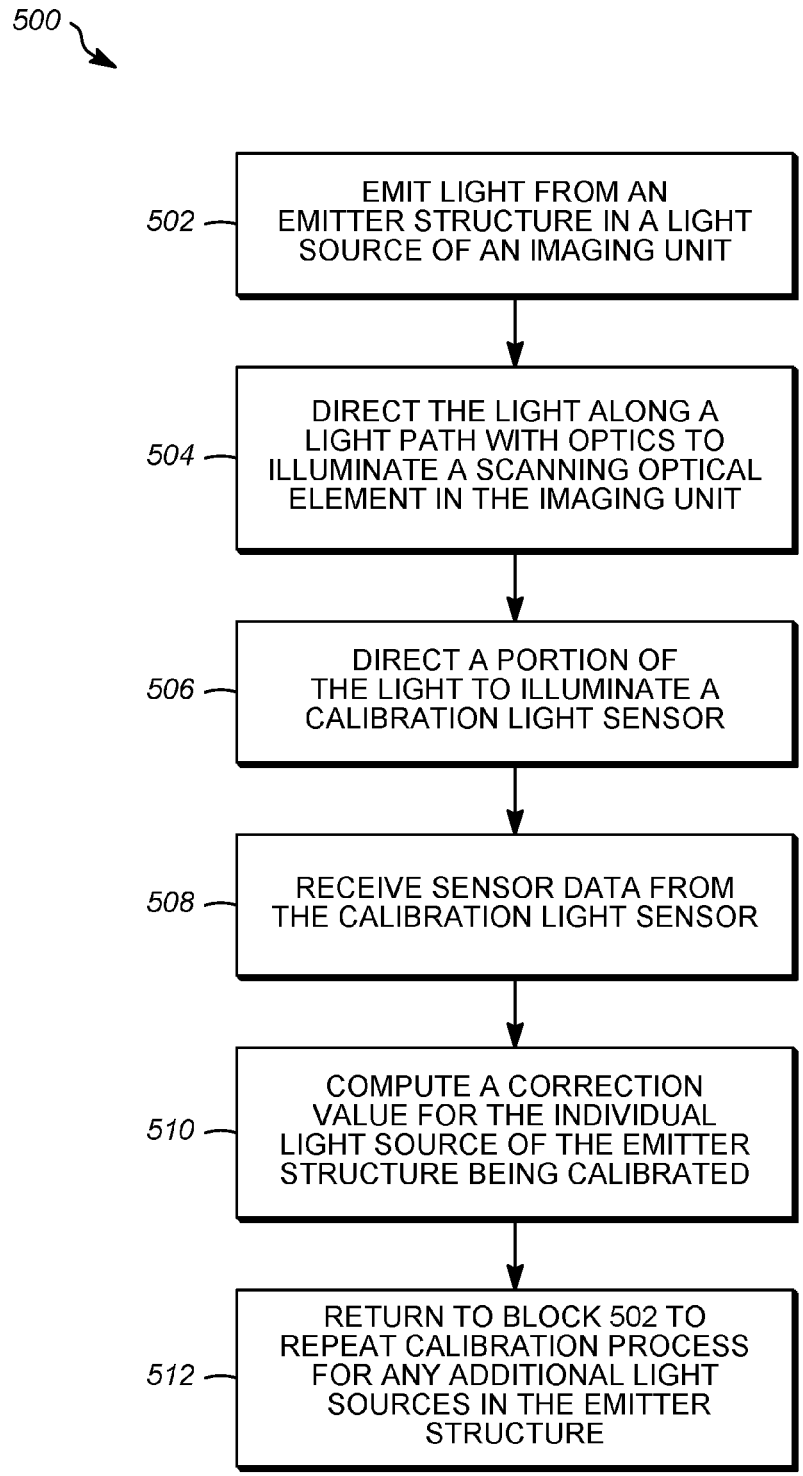
FIG. 8 is a flowchart illustrating one example of a method for calibrating the light sources in an imaging unit of a wearable device.

Example method 500 is described with reference to FIG. 8 in accordance with one or more embodiments of an imaging unit calibration process. The calibration process may be implemented on a periodic basis to ensure that calibration is maintained. Generally, any of the services, functions, methods, procedures, components, and modules described herein can be implemented using software, firmware, hardware (e.g., fixed logic circuitry), or any combination thereof. A software implementation represents program code that performs specified tasks when executed by a computer processor. The example methods may be described in the general context of computer-executable instructions, which can include software, applications, routines, programs, objects, components, data structures, procedures, modules, functions, and the like. The program code can be stored in one or more computer-readable storage media devices, both local and/or remote to a computer processor. The methods may also be practiced in a distributed computing environment by multiple computer devices. Further, the features described herein are platform-independent and can be implemented on a variety of computing platforms having a variety of processors.

At block 502, light is emitted from a single light source to be calibrated of an emitter structure in an imaging unit. For example, the imaging unit 202 (FIG. 3) includes the emitter structure 206, which can be implemented as individual light sources such as the aforementioned laser diodes. During the calibration process the individual light sources cycle to emit light one at a time. At block 504, light from the particular light source being calibrated is directed along a light path with optics to illuminate an electrically alterable scanning optical element (e.g., a scanning mirror) in the imaging unit. For example, in the imaging unit of FIG. 3, the optics in the imaging unit 202, such as the partially reflecting mirror 210, directs the light along a light path to illuminate the electrically alterable scanning optical element 212.

At block 506, a portion of the light being directed to the scanning optical element is directed to a calibration light sensor prior to reaching the scanning optical element. For example, the partially reflective mirror 210 in the imaging unit 202 of FIG. 3 reflects a portion of the light to illuminate the calibration photodiode 230. At block 508, sensor data is received from the calibration light sensor. For example, the sensor data, which corresponds to the power or intensity of the emitted light output from the light source being calibrated, may be received by the calibration photodiode management circuit 255 shown in FIG. 5, which in turn provides the sensor data to control system 245.

At block 510, a correction value is computed for the particular light source that is currently being calibrated. For example, in an embodiment that employs a laser diode and the control circuitry 126 of FIG. 5, the control system 245 can use the sensor data obtained from the calibration photodiode management circuit 255 to calibrate the signal received from the configuration measurement circuit 240 so that the signal from the configuration measurement circuit 240 accurately represents the power or intensity of light emitted by the front facet of the laser diode. In this way the control system 245 can use the signal received from the configuration measurement circuit 240 to adjust the current or other signal characteristic supplied to the drive circuitry 250 to ensure that the laser diode 106 emits the desired light output during operational periods after completion of the calibration process.

At block 512, the process returns to block 502 to repeat the calibration process for another light source in the emitter structure. This process may be repeated for each and every light source in the emitter structure.

Figure 9:
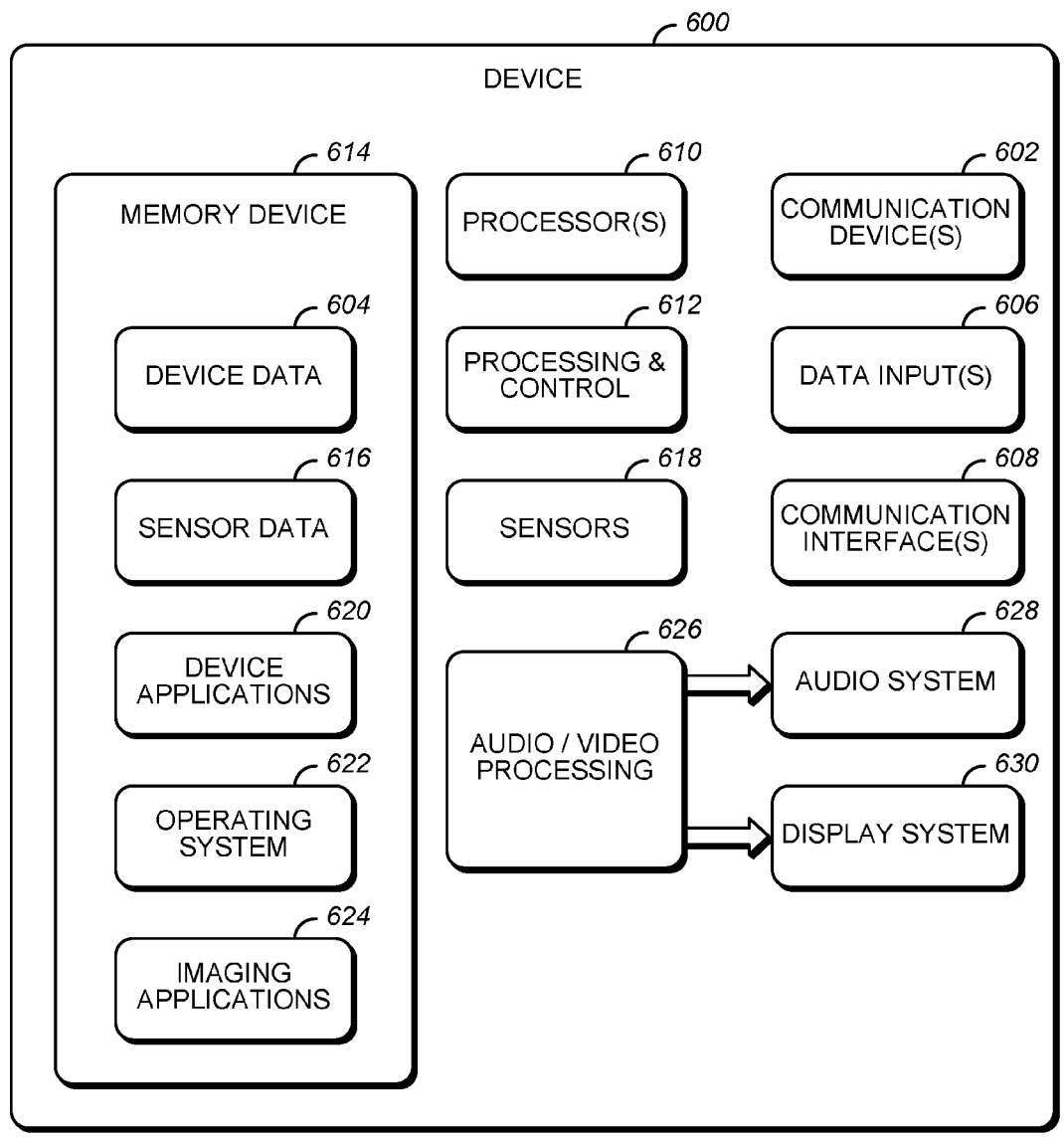
FIG. 9 a block diagram illustrating various components of an example device that can be implemented as any of the devices described with reference to any of the wearable head mounted displays described herein.

FIG. 9 illustrates various components of an example device 600 that can be implemented as any of the devices described with reference to any of the aforementioned embodiments, such as a wearable display device and/or a controller for a wearable display device. In embodiments, the device may be implemented as any one or combination of a fixed or mobile device, in any form of a consumer, computer, portable, communication, phone, navigation, appliance, gaming, media playback, and/or electronic device. The device may also be associated with a user (i.e., a person) and/or an entity that operates the device such that a device describes logical devices that include users, software, firmware, hardware, and/or a combination of devices.

The device 600 includes communication devices 602 that enable wired and/or wireless communication of device data 604, such as virtual image data, as well as video and images data, and other media content stored on the device. The media content stored on the device can include any type of audio, video, and/or image data. The device includes one or more data inputs 606 via which any type of data, media content, and/or inputs can be received, such as user-selectable inputs and any other type of audio, video, and/or image data received from any content and/or data source.

The device 600 also includes communication interfaces 608, such as any one or more of a serial, parallel, network, or wireless interface. The communication interfaces provide a connection and/or communication links between the device and a communication network by which other electronic, computing, and communication devices communicate data with the device.

The device 600 includes one or more processors 610 (e.g., any of microprocessors, controllers, and the like) or a processor and memory system (e.g., implemented as an SoC), which process computer-executable instructions to control the operation of the device. Alternatively or in addition, the device can be implemented with any one or combination of software, hardware, firmware, or fixed logic circuitry that is implemented in connection with processing and control circuits which are generally identified at 612. Although not shown, the device can include a system bus or data transfer system that couples the various components within the device. A system bus can include any one or combination of different bus structures, such as a memory bus or memory controller, a peripheral bus, a universal serial bus, and/or a processor or local bus that utilizes any of a variety of bus architectures.

The device 600 also includes one or more memory devices 614 (e.g., computer-readable storage media) that enable data storage, such as random access memory (RAM), non-volatile memory (e.g., read-only memory (ROM), flash memory, etc.), and a disk storage device. A disk storage device may be implemented as any type of magnetic or optical storage device, such as a hard disk drive, a recordable and/or rewriteable disc, and the like. The device may also include a mass storage media device. Computer-readable storage media can be any available medium or media that is accessed by a computing device.

A memory device 614 provides data storage mechanisms to store the device data 604, sensor data 616 from calibration sensors 618, other types of information and/or data, and device applications 620. For example, an operating system 622 can be maintained as a software application with the memory device and executed on the processors. The device applications may also include a device manager or controller, such as any form of a control application, software application, signal processing and control module, code that is native to a particular device, a hardware abstraction layer for a particular device, and so on. In this example, the device applications may also include an imaging application 622 that may implement embodiments of an imaging unit calibration process as described herein.

The device 600 may also include an audio and/or video processing system 626 that generates audio data for an audio system 628 and/or generates display data for a display system 630. In implementations, the audio system and/or the display system are external components to the device. Alternatively, the audio system and/or the display system are integrated components of the example device.

Various exemplary embodiments of the present wearable display device are now presented by way of illustration and not as an exhaustive list of all embodiments. An example includes a wearable display device, comprising: left and right display lens systems configured for augmented reality imaging; left and right imaging units of the respective left and right display lens systems configured to generate an augmented reality image, at least one of the left and right imaging units comprising: an emitter structure having one or more light sources configured to emit light; one or more optical elements configured to direct the light along a light path in the imaging unit; a display optic located in the light path; an electrically alterable scanning optical element configured to receive the light from the one or more optical elements and direct the light to the display optic, the electrically alterable scanning optical element being configured to scan in at least one dimension to direct the light through an imaging optic that directs the light into the display optic; and a calibration light sensor for receiving a portion of the light from one of the one of the one or more optical elements, the calibration light sensor being located at a point along the light path between the emitter structure and the electrically alterable scanning optical element.

In another example, the optical element from which the calibration light sensor receives the portion of the light is a partially transmitting mirror. In another example, the calibration light sensor receives the portion of the light transmitted through the partially transmitting mirror. In another example, a remaining portion of the light is reflected to the electrically alterable scanning optical element. In another example, the calibration light sensor receives the portion of the light reflected from the partially transmitting mirror. In another example, the display optic includes a see-through waveguide plate. In another example, a calibration control system is provided that is configured to receive sensor data from the calibration light sensor, the sensor data corresponding to a power level of light generated by the light source. In another example, the calibration control system is configured to conduct a process of calibrating a monitor sensor that monitors light output from the light source, the calibration control system being configured to conduct the calibration process using the sensor data. In another example, the light source is a laser diode and the monitor sensor is a photodiode configured to receive light emitted from a back facet of the laser diode. In another example, the emitter structure includes a plurality of light sources each emitting a different color of light and the calibration control system is further configured to sequentially pulse on and off each of the light sources during the calibration process so that only a single one of the light sources emits light at any given time during the calibration process.

A further example includes a method of calibrating a monitor sensor associated with a light source in an emitter structure of an imaging unit employed in a wearable display device, comprising: (i) directing to a calibration sensor a portion of light emitted by a light source in an emitter structure of an imaging unit employed in a display lens system of a wearable display device configured for augmented reality imaging, a remaining portion of the light being directed to an electrically alterable scanning optical element that is configured to scan in at least one dimension to direct the light through an imaging optic that directs the light into a display optic, the calibration light sensor being located at a point along a light path between the emitter structure and the electrically alterable scanning optical element; (ii) receiving a sensor signal generated by the calibration sensor in response to the portion of light directed to the calibration sensor, the sensor signal representing a power level of light generated by the light source; and (iii) calibrating the monitor sensor associated with the light source using the received sensor signal.

In another example, the emitter structure includes a plurality of light sources and the method further comprises: sequentially pulsing each of the light sources so that only a single one of the light sources emit light at any given time; and repeating steps (i)-(iii) for each of the light sources. In another example, directing the portion of light to the calibration sensor includes directing the light emitted by the light source to a partially reflecting mirror, the partially reflecting mirror directing the portion of light to the calibration sensor. In another example, the partially reflecting mirror transmits the portion of light to the calibration sensor. In another example, the partially reflecting mirror reflects the portion of light to the calibration sensor. In another example, the display optic includes a see-through waveguide plate. In another example, the light source is a laser diode and the monitor sensor is a photodiode configured to receive light emitted from a back facet of the laser diode.

A further example includes one or more computer-readable memory devices storing instructions for calibrating a monitor sensor in a laser diode package associated with a light source in an emitter structure of an imaging unit employed in a wearable display device. The instructions, when executed by one or more processors disposed in a computing device, causes the computing device to: (i) direct to a calibration sensor a first portion of light emitted by a front facet of laser diode in an emitter structure of an imaging unit employed in a display lens system of a wearable display device configured for augmented reality imaging, a remaining portion of the light being directed to an electrically alterable scanning optical element that is configured to scan in at least one dimension to direct the light through an imaging optic that directs the light into a display optic, the calibration light sensor being located at a point along a light path between the emitter structure and the electrically alterable scanning optical element, the first portion of the light being less than the remaining portion of the light; (ii) receive a sensor signal generated by the calibration sensor in response to the portion of light directed to the calibration sensor, the sensor signal representing a power level of light generated by the light source; (iii) receive a monitor signal generated by a monitor sensor that monitors rear facet emissions from the rear facet of the laser diode; and (iv) correlate the monitor signal with the sensor signal so that the monitor signal represents a power level of light emitted from the front facet of the laser diode.

Although embodiments of imaging unit calibration have been described in language specific to features and/or methods, the appended claims are not necessarily limited to the specific features or methods described. Rather, the specific features and methods are disclosed as example implementations of imaging unit calibration.

The invention claimed is:

1. A wearable display device, comprising:
left and right display lens systems configured for augmented reality imaging;
left and right imaging units of the respective left and right display lens systems configured to generate an augmented reality image, at least one of the left and right imaging units comprising:
an emitter structure having one or more light sources configured to emit light;
one or more optical elements configured to direct the light along a light path in the imaging unit;
a display optic located in the light path;
an electrically alterable scanning optical element configured to receive the light from the one or more optical elements and direct the light to the display optic, the electrically alterable scanning optical element being configured to scan in at least one dimension to direct the light through an imaging optic that directs the light into the display optic; and
a calibration light sensor configured to receive a portion of the light emitted from said emitter structure and passed through at least one of the one or more optical elements, the calibration light sensor being located at a point along the light path between the emitter structure and the electrically alterable scanning optical element.

2. The wearable display device of claim 1 wherein the optical element from which the calibration light sensor receives the portion of the light is a partially transmitting mirror.

3. The wearable display device of claim 2 wherein the calibration light sensor receives the portion of the light transmitted through the partially transmitting mirror.

4. The wearable display device of claim 3 wherein a remaining portion of the light is reflected to the electrically alterable scanning optical element.

5. The wearable display device of claim 2 wherein the calibration light sensor receives the portion of the light reflected from the partially transmitting mirror.

6. The wearable display device of claim 1 wherein the display optic includes a see-through waveguide plate.

7. The wearable display device of claim 1, further comprising a calibration control system configured to receive sensor data from the calibration light sensor, the sensor data corresponding to a power level of light generated by the light source.

8. The wearable display device of claim 7 wherein the calibration control system is configured to conduct a process of calibrating a monitor sensor that monitors light output from the light source, the calibration control system being configured to conduct the calibration process using the sensor data.

9. The wearable display device of claim 8 wherein the light source is a laser diode and the monitor sensor is a photodiode configured to receive light emitted from a back facet of the laser diode.

10. The wearable display device of claim 7 wherein the emitter structure includes a plurality of light sources each emitting a different color of light, the calibration control system being further configured to sequentially pulse on and off each of the light sources during the calibration process so that only a single one of the light sources emits light at any given time during the calibration process.

11. A method of calibrating a monitor sensor associated with a light source in an emitter structure of an imaging unit employed in a wearable display device, comprising:
  (i) directing to a calibration sensor a portion of light emitted by a light source in an emitter structure of an imaging unit employed in a display lens system of a wearable display device configured for augmented reality imaging, a remaining portion of the light being directed to an electrically alterable scanning optical element that is configured to scan in at least one dimension to direct the light through an imaging optic that directs the light into a display optic, the calibration light sensor being located at a point along a light path between the emitter structure and the electrically alterable scanning optical element;
  (ii) receiving a sensor signal generated by the calibration sensor in response to the portion of light directed to the calibration sensor, the sensor signal representing a power level of light generated by the light source; and
  (iii) calibrating the monitor sensor associated with the light source using the received sensor signal.

12. The method of claim 11 wherein the emitter structure includes a plurality of light sources and further comprising: sequentially pulsing each of the light sources so that only a single one of the light sources emit light at any given time; and repeating steps (i)-(iii) for each of the light sources.

13. The method of claim 11 wherein directing the portion of light to the calibration sensor includes directing the light emitted by the light source to a partially reflecting mirror, the partially reflecting mirror directing the portion of light to the calibration sensor.

14. The method of claim 13 wherein the partially reflecting mirror transmits the portion of light to the calibration sensor.

15. The method of claim 13 wherein the partially reflecting mirror reflects the portion of light to the calibration sensor.

16. The method of claim 11 wherein the light source is a laser diode and the monitor sensor is a photodiode configured to receive light emitted from a back facet of the laser diode.

17. One or more computer-readable memory devices storing instructions for calibrating a monitor sensor in a laser diode package associated with a light source in an emitter structure of an imaging unit employed in a wearable display device, the instructions, when executed by one or more processors disposed in a computing device, causes the computing device to:
  (i) direct to a calibration sensor a first portion of light emitted by a front facet of laser diode in an emitter structure of an imaging unit employed in a display lens system of a wearable display device configured for augmented reality imaging, a remaining portion of the light being directed to an electrically alterable scanning optical element that is configured to scan in at least one dimension to direct the light through an imaging optic that directs the light into a display optic, the calibration light sensor being located at a point along a light path between the emitter structure and the electrically alterable scanning optical element, the first portion of the light being less than the remaining portion of the light;
  (ii) receive a sensor signal generated by the calibration sensor in response to the portion of light directed to the calibration sensor, the sensor signal representing a power level of light generated by the light source;
  (iii) receive a monitor signal generated by a monitor sensor that monitors rear facet emissions from the rear facet of the laser diode; and
  (iv) correlate the monitor signal with the sensor signal so that the monitor signal represents a power level of light emitted from the front facet of the laser diode.

18. The one or more computer-readable memory devices of claim 17 wherein the emitter structure includes a plurality of light sources and further comprising causing the computing device to: sequentially pulse each of the light sources so that only a single one of the light sources emit light at any given time; and repeating steps (i)-(iv) for each of the light sources.

19. The one or more computer-readable memory devices of claim 17 wherein causing the computing device to direct the portion of light to the calibration sensor includes causing the computing device to direct the light emitted by the light source to a partially reflecting mirror, the partially reflecting mirror directing the portion of light to the calibration sensor.

20. The one or more computer-readable memory devices of claim 17 wherein the light source is a laser diode and the monitor sensor is a photodiode configured to receive light emitted from a back facet of the laser diode.

* * * * *